United States Patent [19]
Takekoshi

[11] Patent Number: 4,896,869
[45] Date of Patent: Jan. 30, 1990

[54] MOVING TABLE APPARATUS

[75] Inventor: Kiyoshi Takekoshi, Yamanashi, Japan

[73] Assignee: Tokyo Electron Limited, Tokyo, Japan

[21] Appl. No.: 263,273

[22] Filed: Oct. 27, 1988

[30] Foreign Application Priority Data

Oct. 30, 1987 [JP] Japan .................. 62-275075

[51] Int. Cl.[4] ............................................. B23Q 3/18
[52] U.S. Cl. ....................................... 269/60; 269/71; 269/309
[58] Field of Search ............ 269/73, 71, 60, 285, 269/240, 309, 310; 108/20, 137, 143; 350/529, 531; 248/657, 178, 651, 429; 33/1 M; 74/479; 73/869.91

[56] References Cited

U.S. PATENT DOCUMENTS

| | | | |
|---|---|---|---|
| 2,969,222 | 1/1961 | Seara | 259/103 |
| 3,638,933 | 2/1972 | Burnette et al. | 269/309 |

FOREIGN PATENT DOCUMENTS

| | | | |
|---|---|---|---|
| 2736204 | 2/1974 | Fed. Rep. of Germany | 269/309 |
| 57-61436 | 9/1982 | Japan . | |
| 60-34740 | 8/1985 | Japan . | |
| 60-238707 | 11/1985 | Japan . | |
| 61-37473 | 1/1986 | Japan . | |
| 61-132804 | 6/1986 | Japan . | |
| 61-30419 | 7/1986 | Japan . | |
| 61-82735 | 8/1986 | Japan . | |
| 61-40085 | 9/1986 | Japan . | |
| 61-154638 | 9/1986 | Japan . | |
| 62-5420 | 1/1987 | Japan . | |
| 118945 | 1/1984 | U.S.S.R. | 269/309 |

*Primary Examiner*—Robert C. Watson
*Attorney, Agent, or Firm*—Oblon, Spivak, McClelland, Maier & Neustadt

[57] ABSTRACT

A moving table apparatus includes a base, two guide rails laid on the base and extending in a direction Y, a first table capable of moving on rails, in direction Y, two guide rails laid on the first table and extending a direction X, and a second table capable of moving on the guide rails laid on the first table, in direction X. The first table has a main table located on the side of the base, a support table supporting the second table, and a pin supporting the support table what is rotatable relative to the main table. Before the main and support tables are fastened together by means of screws, the support table is rotated around the pin, thereby adjusting the angle between two straight lines extending in directions X and Y, respectively.

18 Claims, 5 Drawing Sheets

MOVING TABLE APPARATUS

BACKGROUND OF THE INVENTION

1. Field of the Invention

The present invention relates to a moving table apparatus wherein a table can be moved in a two different directions from the first direction.

2. Description of the Related Art

An X-Y table designed to move in two directions which are perpendicular to each other is well known and generally includes a base, on which is mounted a first table serving as a first moving support, to move in, for example, a direction Y, and a second table mounted on the first table and serving as a second moving support, to move in a direction X, which is perpendicular to direction Y. The first table is movably supported on two rails laid on the base, by means of bearings which contact the rails, while the second table is movably supported likewise on two rails laid on the first table. Since the second table moves in the direction Y, while the first table which supports the second table is moving in the direction X, the second table moves after all in both the direction X and the direction Y.

Among other uses, an X-Y table such as is described above is used as an alignment apparatus for use in a probing machine which examines the electrical properties of semiconductor wafers. This alignment apparatus has a probe card and a plurality of probes suspended from the probe card, and is designed to move each wafer, with the probes electrically connected to the electrodes formed and arranged on the wafer in rows and columns.

The X-Y table is also used in, for example, a machine tool, for positioning a work piece.

Particularly, an X-Y table used as an alignment apparatus must be designed such that the first and second tables are moved exactly in two straight lines which cross at a predetermined angle. The conventional assembly technique does not suffice to assemble the components of the X-Y table to allow the first and second tables to move in said two straight lines. An adjusting technique needs to be applied to adjust the angle between the two straight lines.

To adjust the angle accurately, use is made of a plate which has a lattice pattern printed on it and which is fixed on the second table. (The plate is fixed on a chuck supported on the second table and holding a wafer, in the case where the X-Y table is used in a probing machine.) A person who is engaged in assembling the X-Y table moves the second table in the direction Y, while moving the first table in the direction X, thus moving the second table in both directions. He observes, through a microscope, how the two tables move, with reference to the lattice pattern printed on the plate. When he finds that the straight lines extending in the directions X and Y, in which the first and second tables have been moved, cross at an angle different from the predetermined one, he changes the positions of the components of the X-Y table, thereby adjusting the angle to the predetermined one.

More specifically, the person may adjust the angle in one of the following two alternative methods.

In the first method, the bolts fastening a support table supporting the second table to a main table, which form the first table jointly with the support table, are loosened, and the support table is moved relative to the main table, thereby to adjust the angle to the predetermined angle. The support table can be so moved since the holes cut in both the support table and the main table have a diameter far greater than that of the bolts.

In the second method, the positional relationship between two bearings for moving the first and second tables, respectively, is changed, thereby to adjust the angle to the predetermined angle.

In the first method, however, no reference is given for positioning the support table. The support table may be moved in all directions, making it difficult to adjust the angle correctly.

With the second method, it is difficult to determine how much either bearing must be moved to adjust the angle to the desired extent. In addition, it is necessary to adjust the position of the magnet for attracting the bearing to a rail. The second method is complex and difficult.

SUMMARY OF THE INVENTION

The present invention is intended to overcome the above-mentioned drawbacks and has as its object to provide a moving table apparatus capable of easily adjusting desirably an angle between two straight lines extending in two direction in which two moving supports are moved respectively.

A moving table apparatus according to the present invention comprises a base, a first moving support moving on the base in a first direction, a second moving support moving on the first table and in a second direction, different from the first direction, adjusting means for moving the first moving and the second moving supports relative to each other, thereby adjusting to a predetermined value an angle between two lines extending in the first and second directions. cl BRIEF DESCRIPTION OF THE DRAWINGS FIG. 1 is a partly-sectioned front view showing a probing machine provided with an alignment apparatus which includes an example of the moving table apparatus (X-Y table) according to the present invention;

DETAILED DESCRIPTION OF THE PREFERRED EMBODIMENT

A case will now be described, with reference to the accompanying drawings, wherein the moving table apparatus of the present invention is used as part of a wafer alignment apparatus of a probing machine which examines the electrical properties of semiconductor wafers.

Figure 1:
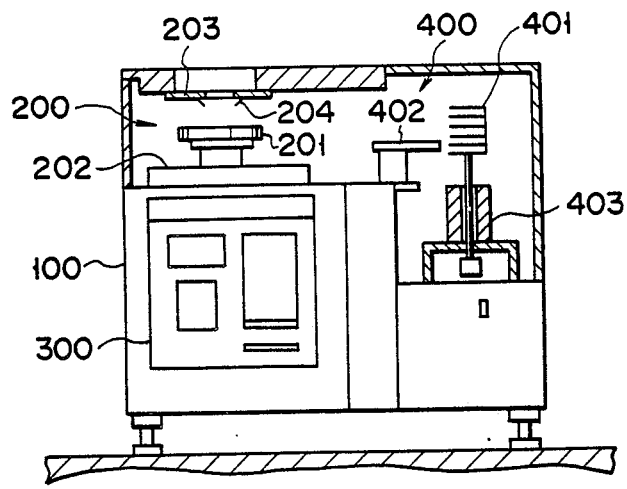

FIG. 1 is a partly-sectioned front view showing the probing machine provided with the moving device of the present invention. The probing machine includes housing 100, measuring section 200 for measuring the electrical properties of semiconductor wafers, control section 300 for overall control of the machine, and loader section 400 for carrying the wafers to measuring section 200. Wafer cassette 401, in each of which a plurality of wafers are stocked, is arranged at loader section 400. Wafer cassette 401 is driven by driving section 403 and the wafers in wafer cassette 401 are carried to measuring section 200 by means of transfer apparatus 402. Chuck 201, for vacuum-sucking one of the wafers which has been carried from loader section 400, is provided at measuring section 200. Probe card 203 having a large number of probes 204 is located above chuck 201, facing chuck 201. Alignment device 202 is located under chuck 201 which is moved in directions X, Y, Z and $\theta$ by alignment device 202 to contact the probes with plural pads on the wafer on it so as to measure the electric properties of the wafer.

Alignment device 202 comprises an X-Y table designed to move in X and Y directions, which are perpendicular to each other (it may alternatively be designed, if so desired, to move in two directions which are oblique to each other), and a Z-$\theta$ moving apparatus for moving the table in direction Z and $\theta$. The X-Y table is the moving table apparatus of the present invention.

Figure 2:
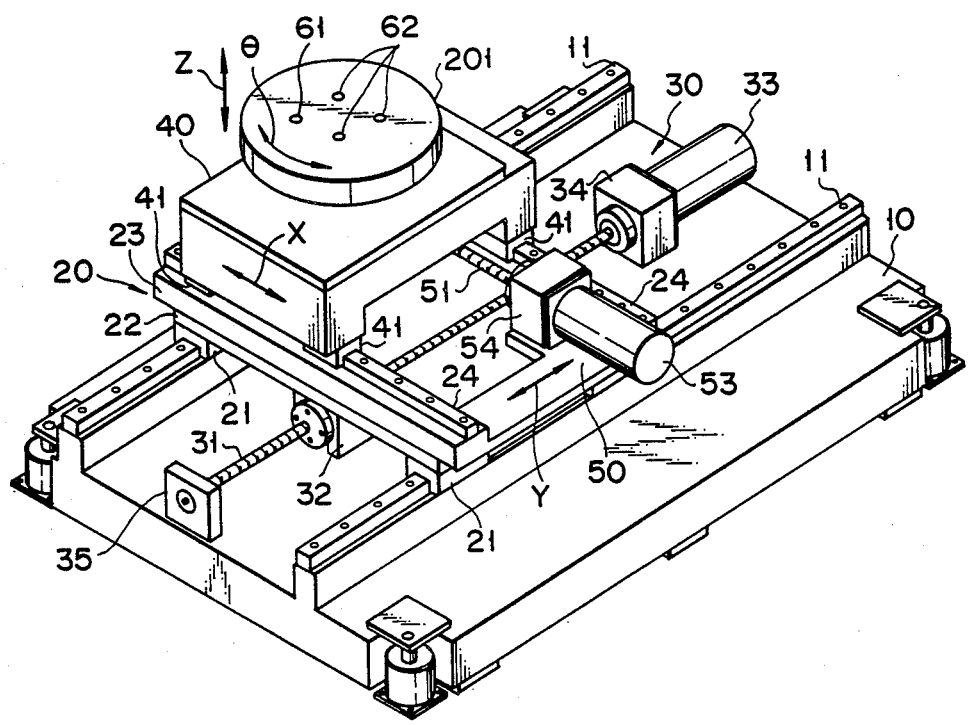
FIG. 2 is a perspective view showing the moving table apparatus (X-Y table) shown in FIG. 1.

FIG. 2 is a perspective view showing the X-Y table of alignment apparatus 202. The X-Y table includes base 10, first table 20 moving in direction Y, driving system 30 for driving first table 20 in direction Y, second table 40 moving in direction X and driving system 50 for moving second table in direction X.

Two straight guide rails 11 for supporting first table 20 movable in direction Y are mounted on base 10. First table 20 includes main table 22 provided with four support members 21 which are movably supported on guide rails 11, and support table 23 mounted on main table 22 to support second table 40. Two support members 21 are mounted on every guide rail 11 and each of the support members is provided with plural bearings (not shown) contacting the guide rail. These bearings enable first table 20 to be easily moved. Support table 23 is arranged to rotate relative to main table 22, as will be described later. Two straight guide rails 24 for supporting second table 40 movable in direction X are mounted on support table 23.

Driving system 30 for driving first table 20 in direction Y is mounted on base 10, and includes lead screw 31 extending in direction Y, nut section 32 fixed to first table 20 and screwed onto lead screw 31, motor 33 for driving lead screw 31, coupling 34 for connecting one end of lead screw 31 to motor 33, and support 35 for supporting the other end of lead screw 31. According to driving system 30, lead screw is rotated by motor 33 to move first table 20, which is fixed to nut section 32, in direction Y.

Figure 3:
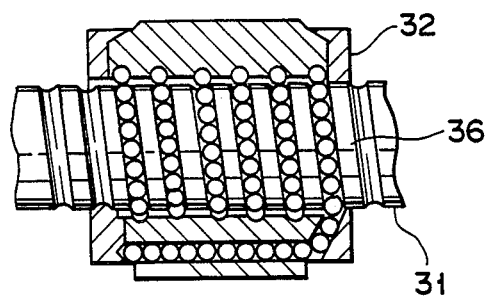
FIG. 3 is a sectional view showing the main portion of a ball screw employed in the drive system for driving the moving table device.

Lead screw 31 and nut section 32 are made of hardened steel and, as shown in FIG. 3, a plurality of balls 36 made of steel, for example, are interposed between lead screw 31 and nut section 32. This is called a ball screw structure. This ball screw uses rolling friction created by rolling balls instead of the sliding friction which is seen in the case of common screw. The mechanical (or screwing) efficiency of a common lead screw is only 20–30% but that of a ball screw reaches about 95%. When the lead screw 31 is rotated, therefore, nut section 32 can be moved with high efficiency.

Second table 40 is provided with four support members 41 movably supported on two guide rails 24. Two support members 41 are mounted on every guide rail 24 and each of support members 41, similar to support members 21, is provided with plural bearings (not shown) contacting with the guide rail. Second table 40 supports chuck 201 which vacuum-sucks a semiconductor wafer, as described above. A means (not shown) for moving chuck 201 in direction Z (or up and down) and in direction 8 (or rotating direction) is located under second table 40. Chuck 201 is provided with hole 61 for vacuum-sucking the semiconductor wafer, and three pins 62 which elevate to lift the semiconductor wafer when it is exchanged with another one.

Driving system 50 for moving second table 40 in direction X has the same arrangement as that of driving system 30 and includes lead screw 51, a nut section (not shown), motor 53, coupling 54 and a support (not shown). Lead screw 51 is rotated by motor 53 to move second table 40, which is fixed to the nut section, in direction X.

First table 20 will be described in detail. It is of the duplex-structure type comprising main table 22 and support table 23.

Figure 4A:
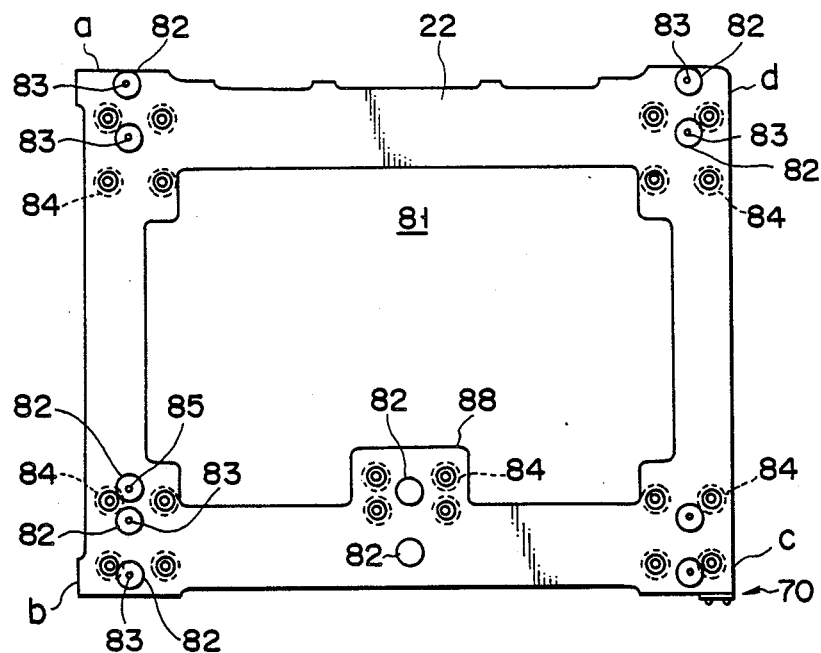
FIG. 4A is a plan view showing a main table as used in the moving table apparatus.
Figure 4B:
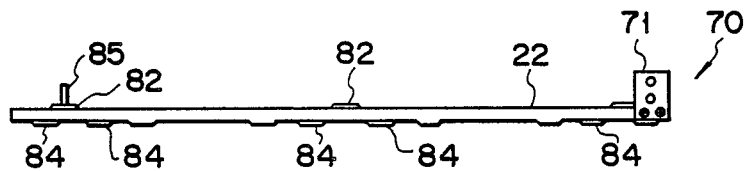
FIG. 4B is a side view of the main table shown in FIG. 4A.

As shown FIGS. 4A and 4B, main table 22 is substantially rectangular, having hollow section 81 in the center thereof. This hollow section 81 enables the Z-$\theta$ driving apparatus to be located under second table 40 and to move up and down therethrough. Eleven bosses project from the upper surface of main table 22; two from each of corners a, b and c, three from lower left corner b in FIG. 4A, and two from attachment area 88 to which nut section 32 is attached. Eight of these bosses 82 which are arranged at four corners of main table 22 are provided with screw holes 83 in the centers thereof into which screws for fixing the support table are screwed. Pin 85 extending upward is fixed on one of the bosses at corner b which is provided with a screw hole 83. Twenty bosses 84 (four at each of the corners and four at attachment area 88) projecting downward are arranged on the underside of main table 22.

Rotation adjusting section 70 which will be described later is attached to one side of lower right corner c in FIG. 4A. As shown in FIG. 4B, plate 71 of this rotation adjusting section 70 is screw-fixed to main table 22.

Figure 5A:
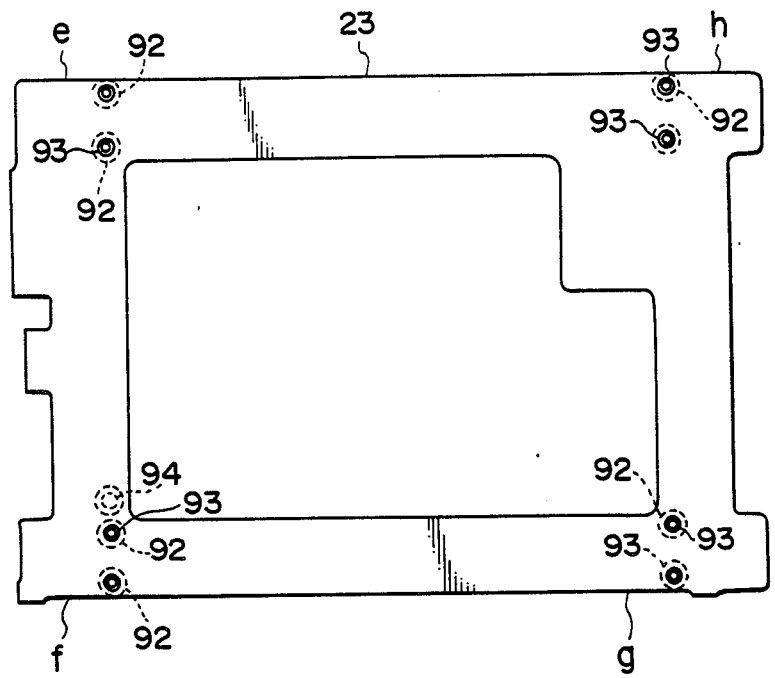
FIG. 5A is a plan view showing a support table as used in the moving table apparatus.
Figure 5B:
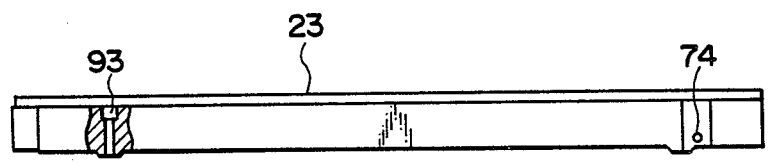
FIG. 5B is a side view of the support table shown in FIG. 5A.

As shown in FIGS. 5A and 5B, support table 23 is substantially rectangular, having hollow section 91 in the center thereof and hollow section 91 is intended to achieve same object as above-described hollow section 81. Nine bosses 92 project downward; and including two from each of corners e, g and h which correspond to corners a, c and d of main table 22 and three from corner f which corresponds to corner b of main table 22 are arranged on the underside of support table 23. Eight of these nine bosses 92 are located corresponding to bosses 82 provided with screw holes 83 and, as shown in FIG. 5B, stepped through-holes 94 are formed in the centers of these eight bosses 92, corresponding to screw holes 83. When fastening screws are inserted through -holes 94 and then screwed into screw holes 83, support table 23 is fixed to main table 22. Each of these through-holes 94 has a diameter substantially larger than that of the screw to make it possible to adjust the position of support table 23 relative to main table 22. The remaining boss arranged at corner f has hole 93 into which pin 85 is inserted. Therefore, support table 23 is supported on main table 22 and can be rotated around pin 85 before support table 23 is fixed to main table 22 by means of screws. Screw hole 96 into which pulling screw 73 which will be described later is screwed is formed at that position of support table 23 which corresponds to rotation adjusting section 70.

Figure 6:
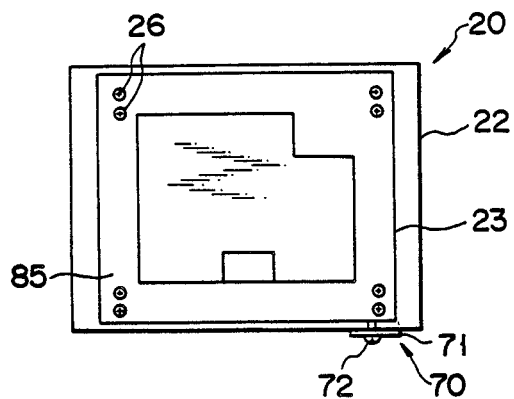
FIG. 6 is a plan view showing a first table comprising the main and support tables.
Figure 7:
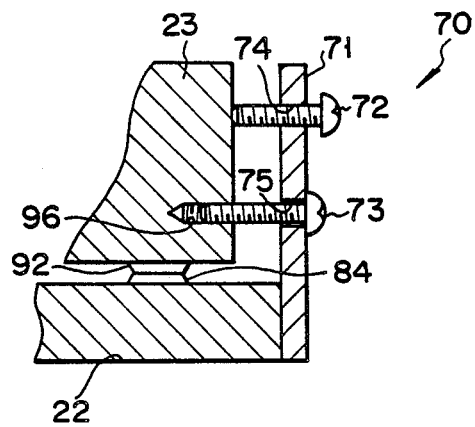
FIG. 7 is a sectional view showing a rotation adjusting section of the moving table apparatus.

FIG. 6 is a plan view showing support table 23 put on main table 22. As described above, pin 85 is a center around which support table 23 is rotated and support table 23 is rotated relative to main table 22 to adjust its position before support table 23 is screw-fixed to main table 22. This position adjustment is carried out by rotation adjusting section 70, which includes plate 71 attached to main table 22, pushing screw 72 screwed into hole 74 in plate 71 and contacted with support member 23 at the foremost end thereof, and pulling screw 73 which is screwed into hole 96 in support member 23 and passes through-hole 75 in plate 71. Support table 23 is moved by these screws 72 and 73 to adjust the position of support table 23 relative to main table 22, so that the angle (i.e., squareness) between straight lines extending directions in which first table 20 and second table 40 are moved respectively can be adjusted to a predetermined value.

It will be described in detail how the angle is adjusted. Screws 26 are temporarily inserted through the through-holes in support table 23 and into the screw holes in main table 22. A plate having a lattice pattern printed on it for measuring the angle is then mounted and fixed onto chuck 201.

In this state, chuck 201 is moved by a certain distance in directions X and Y by driving motors 33 and 53. The lattice pattern printed on the plate is observed under a microscope, thereby determining how much the pattern has displaced from the line extending in the direction Y and how much the angle between this line and the line extending in the direction X has changed from 90°.

Support table 23 is rotated round pin 85 by pushing and pulling screws 72 and 73 of rotation adjusting section 70 according to this information to make the shift of the lattic pattern zero.

When this shift becomes zero, screws 26 are screwed into screw holes in main table 22 to completely fix main and support tables 22 and 23 together. The adjustment of the angle is thus finished.

As described above, the adjustment of the angle can be carried out only by rotating the support table 23 around pin 85 by means of rotation adjusting section 70, that is, on the basis of primary information of the rotating amount of screws 72 and 73 at rotation adjusting section 70. As compared with conventional manners where no reference is used in adjusting the crossing angle and where the difficult process of adjusting the position of bearings is needed to adjust the crossing angle, therefore, the present invention can make it much easier to adjust the angle. No skill is needed and anybody can adjust the crossing angle. The accuracy of adjusting the crossing angle can be made high because it is sufficient only to rotate support table 23 round pin 85. This accuracy can be made higher because support table 23 is rotated by means of the screws. The adjustment of the angle was practiced using this example of the present invention. The process of adjusting the angle can be finished in 10 minutes, thereby enabling the process to be shortened by 80%, as compared with the conventional cases. In addition, the angle-adjusting accuracy could be enhanced about 20% higher than in the conventional cases.

After the crossing angle is adjusted in this manner, motors 33 and 53 are driven independently of the other to rotate lead screws 31 and 51, respectively. First and second tables 20 and 40 are thus located at their desired positions. Therefore, chuck 201 can be located at a desired position on a two-dimensional plane to position the semiconductor wafer on chuck 201 opposite to probe card 203. Chuck 201 is rotated in direction $\theta$ by the Z-$\theta$ driving apparatus to position the plural electrode pads on the semiconductor wafer opposite to plural probes 204. When the electrode pads are positioned opposite to probes 204, chuck 201 is moved in direction Z by the Z-$\theta$ driving apparatus to make each of the electrode pads contacted with the corresponding probe. The process of examining the electric properties of the wafer is thus started.

It should be understood that the present invention is not limited to the above-described embodiment. Although the present invention has been described citing the case where it is used as the X-Y table for the alignment apparatus of the probing machine, it can be applied to various moving tables used in the course of positioning process in various fields. Further, it is not limited to the X-Y table but it may be used as a moving table device wherein two moving directions of table are not made perpendicular to each other.

The driving systems which have used the ball screw in this embodiment may use the common screw, belt or the like.

The mechanism for rotating the support table which has been employed in this embodiment is only an example and ball bearings, for example, may be interposed between the main and support tables to more easily rotate the support table. Even when extremely large weight acts on the support table in this case, the support table can be rotated to adjust the crossing angle.

Although the rotation adjusting section has been arranged in the above-described embodiment at the corner adjacent to that corner of the support table where the pin around which the support table is rotated is located, the rotation adjusting section and its rotation center may be located at those corners of the support table which are on a diagonal line. When arranged like this, the rotation adjusting section is located the most distant place from its rotation center and the distance of the support table becomes the largest. This is preferable from the viewpoint of enhancing the adjusting accuracy of the crossing angle.

A pulling or pushing screw and an urging member such as spring may be used to adjust the rotation of the support table instead of the pulling and pushing screws. Or other various means may be used for this.

What is claimed is:

1. A moving table apparatus comprising:
   a base;
   a first moving support moving on the base, in a first direction, said first moving support having a main member and a support member rotatably connected to said main member;
   a second moving support moving on said support member of said first moving support in a second direction, different from said first direction; and
   adjusting means for moving said main member and support member relative to each other, thereby adjusting, to a predetermined value, an angle between two lines extending in said first and second directions.

2. A moving table apparatus according to claim 1, wherein said first moving support includes a connecting member for rotatably connecting said main member and said support member.

3. A moving table apparatus according to claim 1, wherein said base has a first guide member for guiding the first table, and said first moving support has a first support member movably supported on said first guide member.

4. A moving table apparatus according to claim 1, wherein said first moving support has a second guide member for guiding said second moving support, and said second moving member has a second support member movably supported on said second guide member.

5. A moving table apparatus according to claim 1, wherein said adjusting means has a rotation-adjusting member for rotating said support member, thereby changing a position of said support member.

6. A moving table apparatus according to claim 5, wherein said rotation-adjusting member has means for pushing and pulling the support member.

7. A moving table apparatus according to claim 6, wherein said means for pushing and pulling the support table has pushing screw and pulling screw.

8. A moving table apparatus according to claim 1, further comprising a first drive means for driving said first moving support.

9. A moving table apparatus according to claim 8, wherein said first drive means includes a first nut section attached to the first moving support, a first lead screw fixed to the base and screwed through said first nut section, extending in said first direction, and rotating means for rotating said first lead screw.

10. A moving table apparatus according to claim 9, wherein a plurality of balls are interposed between said first lead screw and said first nut section.

11. A moving table apparatus according to claim 1, further comprising a second drive means for driving said second moving support.

12. A moving table apparatus according to claim 11, wherein said first drive means includes a second nut section attached to the second moving support, a second lead screw fixed to the first moving support and screwed through said second nut section, extending in said second direction, and a means for rotating said second lead screw.

13. A moving table apparatus according to claim 12, wherein a plurality of balls are interposed between said second lead screw and said second nut section.

14. A moving table apparatus according to claim 2, wherein said connecting member has a pin located at said main member and serving as a rotating center of said support member.

15. A moving table apparatus according to claim 14, wherein said first moving support is rectangular and said pin is located at one of the corners of said first moving support.

16. A moving table apparatus according to claim 15, wherein said adjusting means is located at a corner of the first moving support different from the corner at which said pin is located.

17. A moving table support table apparatus comprising:
a base;
a first table located above said base; a first rail provided on said base, said first table moving on said first rail in a first direction;
a second table located above said first table;
a second rail providing on said first table, said second table moving on said second rail in a second direction, different from said first direction; and
adjusting means for adjusting, to a predetermined value, the angle between two lines extending in said first and second directions;
said first table having a main table supported on said first rail and a support table rotatably stacked on said main table, said adjusting means rotating said main table and said support table relative to each other, thereby adjusting said angle.

18. A probing machine for examining the electrical properties of an object to be examined by means of a plurality of probes, said machine comprising:
an examining part having an examining position for said object; and
an aligning part for aligning said object, thereby adapting said object to said examining position;
said aligning part including:
a base;
a first moving support moving on said base, in a first direction, and having a main member and a support member rotatably connected to said main member;
a second moving support moving on said support member of said first moving support in a second direction, different from said first direction; and
adjusting means for moving said main member and said support member relative to each other, thereby adjusting, to a predetermined value, an angle between two lines extending in said first and second directions.

* * * * *